United States Patent [19]
Kister

[11] Patent Number: 6,064,215
[45] Date of Patent: May 16, 2000

[54] HIGH TEMPERATURE PROBE CARD FOR TESTING INTEGRATED CIRCUITS

[75] Inventor: January Kister, Menlo Park, Calif.

[73] Assignee: Probe Technology, Inc., Santa Clara, Calif.

[21] Appl. No.: 09/057,080

[22] Filed: Apr. 8, 1998

[51] Int. Cl.[7] .................................................. G01R 31/02
[52] U.S. Cl. ........................................ 324/754; 324/762
[58] Field of Search ................................... 324/754, 758, 324/762, 755, 760, 761

[56] References Cited

U.S. PATENT DOCUMENTS

| | | | |
|---|---|---|---|
| 5,123,639 | 6/1992 | Carlin et al. | 324/760 |
| 5,355,079 | 10/1994 | Evans et al. | 324/754 |
| 5,521,523 | 5/1996 | Kimura et al. | 324/754 X |
| 5,670,889 | 9/1997 | Okubo et al. | 324/762 X |
| 5,884,395 | 3/1999 | Dabrowiecki et al. | 29/825 |

*Primary Examiner*—Josie Ballato
*Assistant Examiner*—T. R. Sundaram
*Attorney, Agent, or Firm*—Lumen Intellectual Property Services

[57] ABSTRACT

A probe card for testing integrated circuits which maintains rigidity and probe alignment at elevated temperatures. The probe card has a number of probes radially oriented on an insulating plate with a nonuniform radial distribution. The probes extend through an insulating ring. The nonuniform radial distribution of probes has gaps which allows for bolt or attachment to attach a rigid plate to the insulating ring. The insulating plate can be made of printed circuit board material, the insulating ring can be made of epoxy. The rigid plate can be made of stainless steel or any other material that maintains rigidity at elevated temperatures. Preferably, the insulating plate also has a stiffener ring located opposite the insulating ring on the top side. The bolts extend through the stiffener ring. The insulating plate has vias which allow the probes to be electrically connected to test electronics located above a top side of the insulating plate. The rigid plate maintains the rigidity of the apparatus and provides heat shielding for the insulating ring and insulating plate. Alternatively, the rigid plate is located above the insulating plate and bolted to the stiffener ring.

43 Claims, 9 Drawing Sheets

HIGH TEMPERATURE PROBE CARD FOR TESTING INTEGRATED CIRCUITS

RELATED APPLICATIONS

This application is a related U.S. Pat. No. 5,884,395 which is hereby incorporated by reference.

FIELD OF THE INVENTION

This invention relates generally to probe cards for testing integrated circuits. More particularly, it relates to probe cards for use at high temperatures, such as for testing semiconductor dies at high temperature.

BACKGROUND OF THE INVENTION

Integrated circuit dies must be tested before they are packaged. Often, integrated circuit dies are defective and it is highly undesirable to package defective dies as packaging often represents an expensive step in the manufacture of integrated circuits.

Probe cards are commonly used in the art of testing integrated circuits dies. Probe cards consist of a flat rigid plate with probes arranged radially on the surface of the plate. The central portions of the probes have tips which are positioned to be aligned with contact pads on a top surface of the integrated circuit die. The probe tips must be accurately aligned so that contact is made with all the contact pads on the integrated circuit die. A typical die may have a dozen or more contact pads.

Another concern in the manufacture and use of probe cards is the planarity of the probe tips. It is desirable when contacting integrated circuit dies to have similar contact forces between all the contact pads and probe tips. Since the top surface of the die and the contact pads are planar, the probe tips must also be planar (and planar parallel to the die top surface) so that the contact forces on the contact pads are the same. Maintenance of probe tip planarity is a very important consideration in the manufacture and use of probe cards.

Presently, many integrated circuit manufacturers are testing integrated circuit dies at elevated temperatures to satisfy military specification requirements. Typically, dies must be tested at temperatures of 125° C. Of course, the probe card must be contacted to the die while the die is at an elevated temperature. The means for heating the die will typically also heat the probe card used to test the die. Therefore, a probe card to be used for testing dies at elevated temperatures must maintain probe tip planarity and alignment at elevated probe card temperatures. Conventional epoxy printed circuit board probe cards soften at high temperatures and so do not maintain adequate probe tip planarity and alignment.

Therefore, it would be an advance in the art of integrated circuit die testing to provide a probe card capable of maintaining probe tip planarity and alignment at elevated temperatures. It would also be an advance in the art to provide a probe card that has increased rigidity at room temperature.

OBJECTS AND ADVANTAGES OF THE INVENTION

Accordingly, it is a primary object of the present invention to provide a probe card that:

1) is rigid at high temperatures so that probe tip planarity is maintained;
2) is easily assembled;
3) is inexpensive;
4) has increased rigidity at normal (room) temperature.

These and other objects and advantages will be apparent upon reading the following description and accompanying drawings.

SUMMARY OF THE INVENTION

These objects and advantages are attained by a probe card having an insulating plate with a top side and a bottom side. An insulating ring is disposed on the bottom side of the insulating plate. A number of probes extend through the insulating ring. The probes are arranged in a nonuniform radial distribution. The nonuniform radial distribution has at least 2 gaps. A rigid plate is attached to the insulating ring by both of bolts extending through the rigid plate, insulating ring and insulating plate. The bolts are located in the gaps so that they do not intersect the probes. Preferably, the rigid plate maintains rigidity at elevated temperatures and so helps prevent misalignment of the probes.

Preferably, the probe card also has a stiffener ring which is located opposite the insulating ring on the top side of the insulating plate. The bolts extend through the stiffener ring. The bolts compress the insulating plate and insulating ring between the stiffener ring and rigid plate.

Preferably, the rigid plate is shaped to fit over the insulating ring. Instead of bolts, any attachment means such as screws, clamps and rivets can be used. The rigid plate can be made of any material that maintains rigidity at elevated temperature such as stainless steel, steel, aluminum, and ceramics. Preferably, the rigid plate is made of stainless steel. The rigid plate can also be bonded to the bottom side with glue in addition to using bolts. Also preferably, the rigid plate has radial and angular expansion slots to prevent buckling during exposure to nonuniform temperature gradients as occur during testing of semiconductor dies.

The insulating plate preferably has vias for electrically connecting the probes on the bottom side with test electronics on the top side. The insulating plate may not have a central hole. If the insulating plate has a central hole the insulating ring and the stiffener ring may extend within the central hole.

An alternative embodiment of the present invention locates the rigid plate on top of the insulating plate. The insulating plate has a top side and a bottom side. The insulating ring is disposed on the bottom side. A number of probes extend through the insulating ring. The probes are arranged in a nonuniform radial distribution. The nonuniform radial distribution has at least 2 gaps. The rigid plate is disposed on the insulating plate top side. Bolts extend through the rigid plate, insulating plate and insulating ring, compressing the insulating plate between the rigid plate and insulating ring. The bolts are located in the gaps so that they do not intersect the probes. The rigid plate maintains rigidity at elevated temperatures and so helps prevent misalignment of the probes.

Preferably, the probe card also has a stiffener ring disposed on the insulating plate top side between the insulating plate and rigid plate. The stiffener ring is disposed opposite the insulating ring such that the bolts compress the insulating plate and stiffener ring between the insulating ring and the rigid plate.

Preferably, the rigid plate is shaped to fit over the stiffener ring. Also preferably, the rigid plate has rigid plate holes for providing electrical conductors access through the rigid plate.

Instead of bolts, any attachment means such as screws, clamps and rivets can be used. The rigid plate can be made of any material that maintains rigidity at high temperature such as stainless steel, steel, molybdenum, ceramics. The rigid plate can also be bonded to the top side with glue in addition to using bolts.

The insulating plate preferably has vias for electrically connecting the probes on the bottom side with test electronics on the top side. The insulating plate may not have a central hole. If the insulating plate has a central hole the insulating ring and the stiffener ring may extend within the central hole.

DETAILED DESCRIPTION

Figure 1:
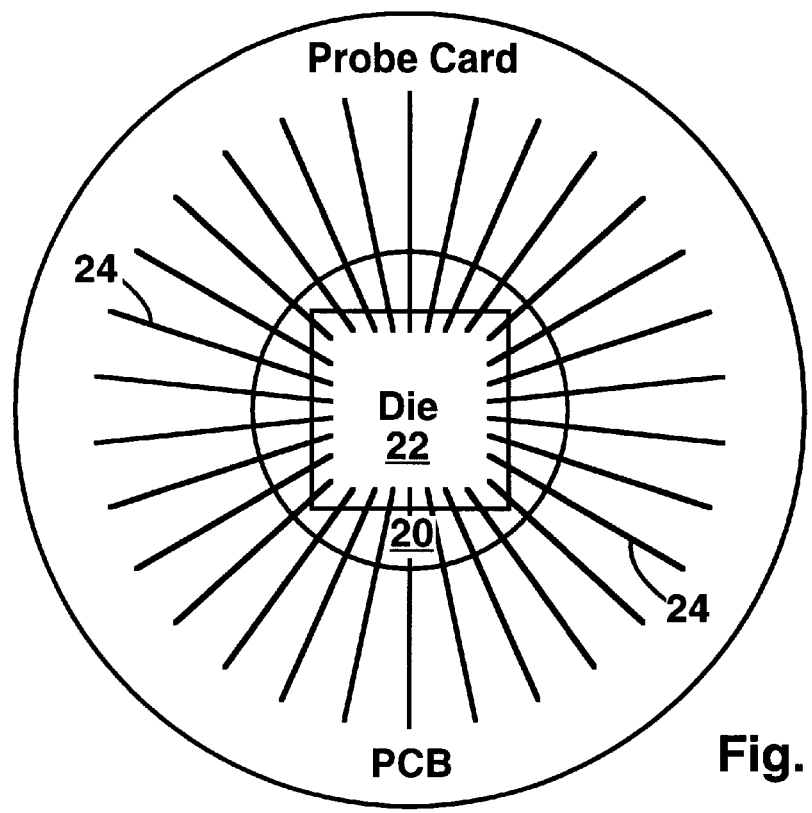
FIG. 1 shows a top view of a prior art probe card having a uniform radial probe distribution.

FIG. 1 shows a typical probe card as commonly known in the art. The probe card comprises a circular plate of printed circuit board (PCB) material such as epoxy board. The PCB has a hole 20 in the middle where a semiconductor die 22 to be tested is placed. An array of probes 24 are radially disposed around the hole in a uniform radial distribution. The probes 24 are uniformly spaced around the hole 20. Every probe 24 is equally spaced from its neighboring probes.

Figure 2:
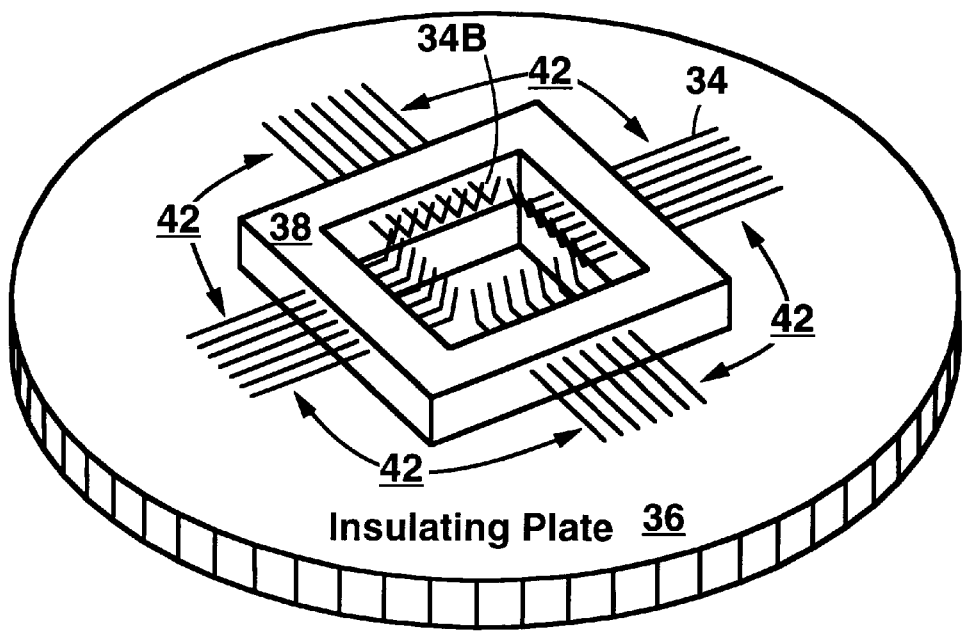
FIG. 2 shows a probe card as disclosed in a prior patent by the present inventor.

FIG. 2 shows a probe card as disclosed by the present inventor in U.S. Pat. No. 5,884,395. Probes 34 are disposed on an insulating plate 36 such as PCB or epoxy board. The probes 34 extend through an insulating ring 38 made of insulating material such as epoxy. A central hole 40 in the insulating plate 36 within the circumference of the ring 38 allows a semiconductor die to easily access probe tips 34B. The probe card of FIG. 2 is characterized in that it uses probes 34 which are nonuniformly radially distributed. Gaps 42 exist between groups of probes 34.

Figure 3:
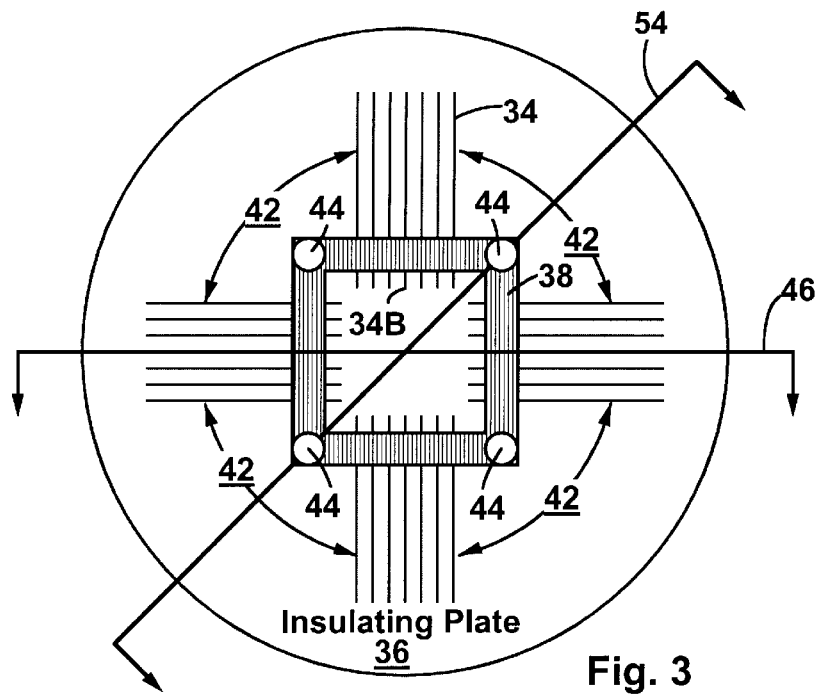
FIG. 3 shows a top view of a preferred embodiment of the present invention.

FIG. 3 is a bottom view of a preferred embodiment of the present invention. For clarity, a rigid plate is not shown. Bolts 44 extend through the insulating ring 38 in a region within the gap 42. In this way, the bolts 44 pass through the insulating plate without intersecting the probes 34. There should be at least two gaps 42 in the probe distribution in order to provide at least two locations for the bolts 44 to be located. Preferably, the insulating plate is made of printed circuit board (PCB) material such as epoxy fiberglass. The insulating ring 38 can be made of epoxy or any material which can be flowed over and around the probes 34 and then hardened. Polyester resin is another material which can be used for the insulating ring 38. Preferably, the insulating ring 38 is made of a hard, rigid material.

Figure 4:
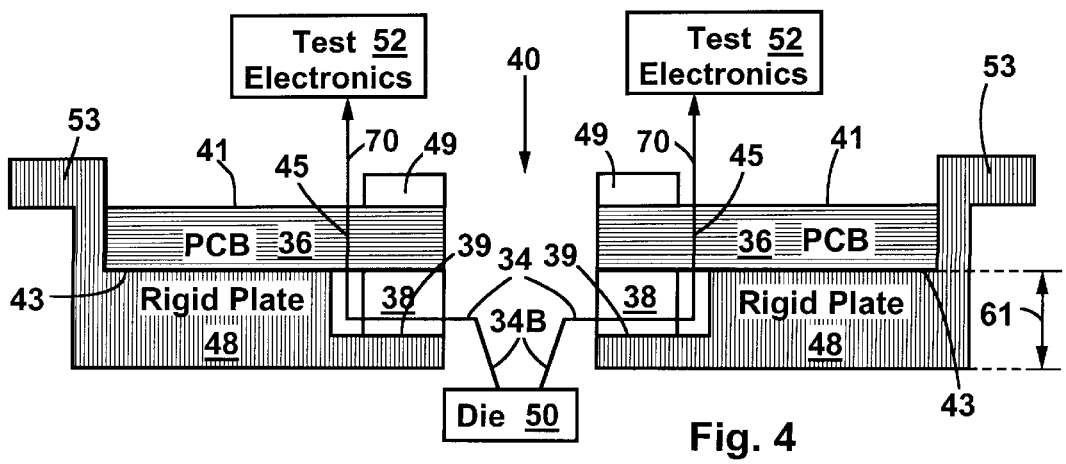
FIG. 4 is a cross sectional side view of the preferred embodiment of the present invention.

FIG. 4 is a cross sectional side view cut through line 46 of FIG. 3. The insulating plate 36 has a top side 41 and a bottom side 43. The insulating ring 38 is attached to the bottom side 43 of the insulating plate 36. A rigid plate 48 is attached to the insulating ring 38 on the bottom surface 39 of the ring 38. The rigid plate 48 can be made of stainless steel, steel, aluminum, ceramics or any other heat resistant material which maintains rigidity at elevated temperatures. Preferably, the rigid plate 48 is made of stainless steel. Ceramics are not preferred as they are brittle and not very heat-conductive. A stiffener ring 49 is disposed on the top side 41 of the insulating plate opposite the insulating ring 38. The stiffener ring 49 is preferably included but optional. Optionally, the rigid plate 48 is glued to the bottom side 43 of the insulating plate 36. The rigid plate is thick enough to provide rigid, stiffening support for the insulating plate 36 and insulating ring 38. In a preferred embodiment, the rigid plate is made of stainless steel and has a thickness 61 of about 0.25 inches.

The probes 34 extend through the insulating ring 38. The probes 34 are connected to electrical connections 70 which pass through the insulating plate 36 and are connected to test electronics 52. Electrical connections are made from the bottom side 43 to the top side 41 by means of metal-electroplated vias 45 extending through the insulating plate 36. The test electronics are disposed on the top side 41 of the insulating plate 36.

A semiconductor die 50 having an integrated circuit on its top surface is in contact with the probe tips 34B. The die 50 is held at an elevated temperature while being contacted to the probe tips 34B. The die (and heat source for the die, which is not shown) tends to heat nearby parts such as the ring 38, rigid plate 48, and insulating plate 36. The ring 38 and insulating plate 36 may soften and deform at elevated temperatures (since they are made of epoxy), but the rigid plate 48 maintains rigidity at elevated temperatures. The rigid plate 48 prevents any softening of the ring 38 or insulating plate 36 from affecting the positioning of the probe tips 34B. Also, the rigid plate 48 helps to protect the insulating ring 38 from heat and conducts heat away from the insulating ring 38. The rigid plate 48 provides heat shielding.

Semiconductor dies 50 are typically tested at temperatures of about 125° C. Therefore, the rigid plate 48 should be able to maintain rigidity at such temperatures. The rigid plate 48 has a lip 53 which aids in connecting the apparatus to external machinery. Preferably, the rigid plate 48 is shaped as shown to fit over the ring 38. More specifically, the rigid plate 48 conforms to the shape of the ring 38. Space may exist between the side of the ring and the rigid plate 48 to allow for the probes 34 to access the vias 45 in the insulating plate 36. Alternatively, the ring 38 may cover the vias 45.

Figure 5:
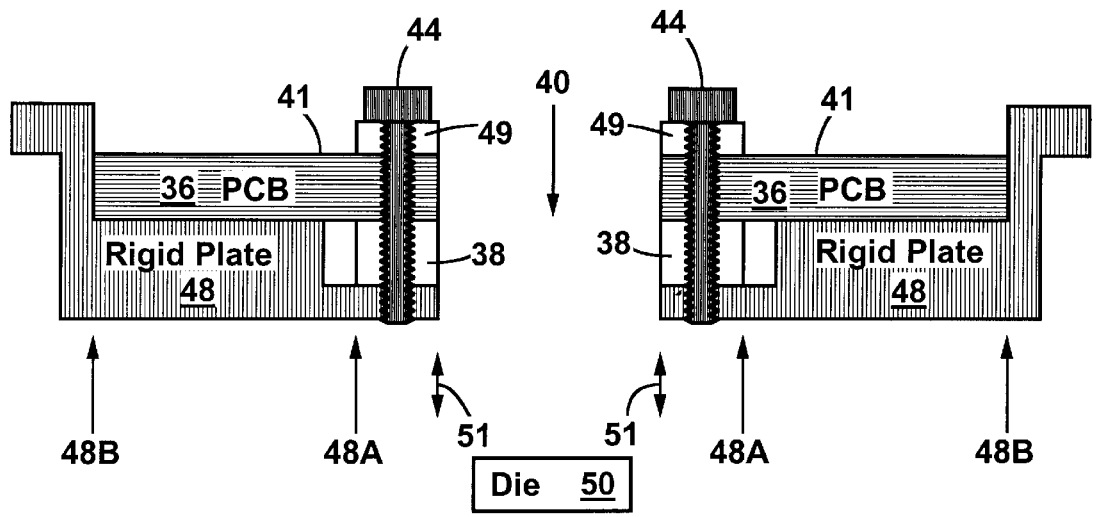
FIG. 5 is another cross sectional side view of the preferred embodiment of the present invention.

FIG. 5 is a cross sectional side view cut through line 54 of FIG. 3. The bolts 44 extend through the stiffener ring 49, insulating plate 36, insulating ring 38, and rigid plate 48.

The stiffener ring 49 serves to increase the rigidity of the apparatus and protect the insulating plate 36 from injury which may otherwise result when tightening the bolts 44. The stiffener ring 49 is preferably made of the same material as the insulating ring 38, but can also be made of a rigid metal such as that used for the rigid plate 48. The bolts 44 compress the insulating plate 36 and insulating ring 38 between the stiffener ring 49 and rigid plate 48. It is noted that many other attachment means besides bolts 44 can be used. Screws, clamps and rivets are examples of other attachment devices which can be used in place of the bolts 44.

It is noted that the rigid plate 48 will have a temperature gradient from center 48A to periphery 48B while in operation. The center will have a higher temperature due to closer proximity to the heated semiconductor die 50. The higher temperature at the center 48A can cause the rigid plate 48 to buckle, thereby disturbing the alignment of the probe tips 34B. Specifically, the hot center 48A expands and buckles in a direction 51 perpendicular to the plane of the plate. This can cause the probe tips 34B to be nonuniformly deflected in a direction towards or away from the semiconductor die 50.

Figure 6A:
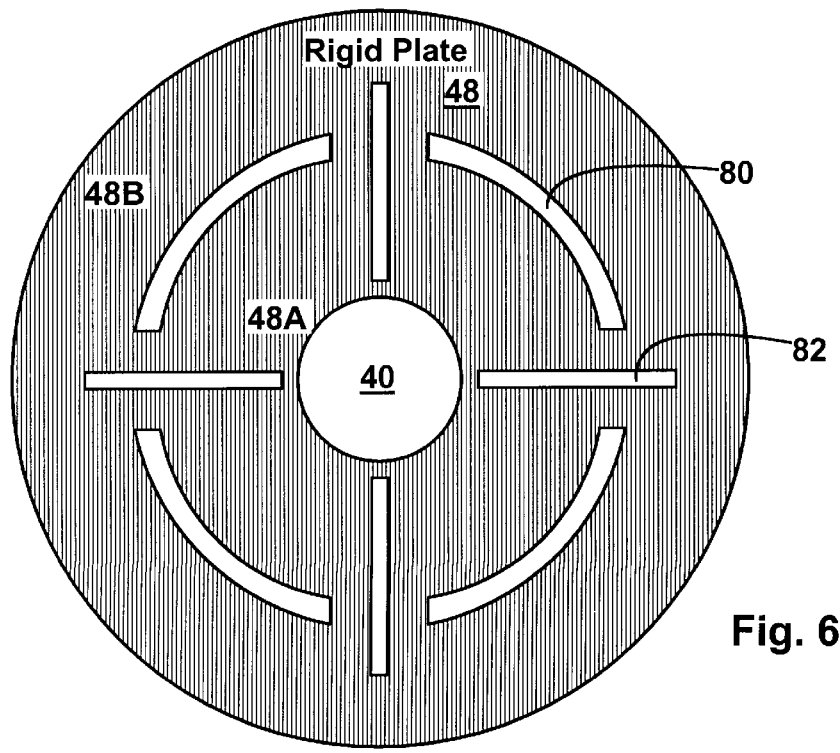
FIG. 6A is a top view of a preferred embodiment of a rigid plate in which the rigid plate has radial and angular thermal expansion slots.

FIG. 6A shows a top view of a rigid plate designed to minimize buckling. Radial thermal expansion slots 80 and angular thermal expansion slots 82 are preferably cut into the rigid plate 48.

The thermal expansion slots 80, 82 will allow the center 48A to expand more than the periphery 48B without causing buckling.

This allows the alignment of the probe tips 34B to remain unchanged during temperature changes. More than one set of expansion slots 80, 82 can be used on a single plate 48. Sixteen slots can be located symmetrically in the rigid plate, for example.

Figure 6B:
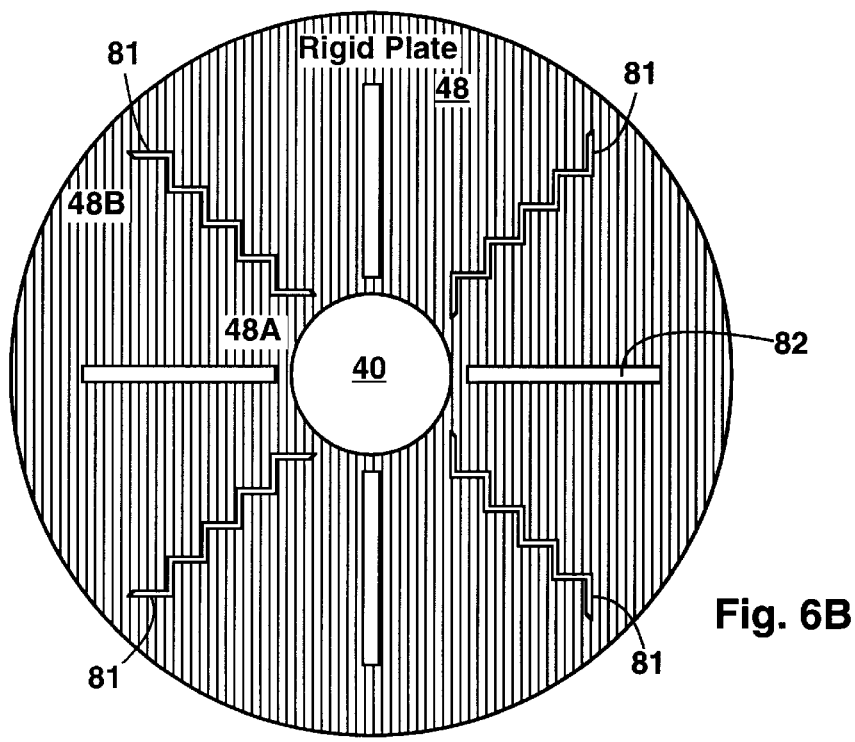
FIG. 6B is a top view of a rigid plate that has zig-zag thermal expansion slots.

FIG. 6B shows another embodiment of a rigid plate 48 designed to reduce buckling. Radial zig-zag thermal expansion slots 81 provide increased expansion flexibility in the radial direction, thereby further reducing the tendency of the rigid plate to buckle during temperature changes. The present invention includes other possible slot and throughhole shapes that reduce buckling caused by nonuniform thermal expansion of the rigid plate 48.

Figure 7:
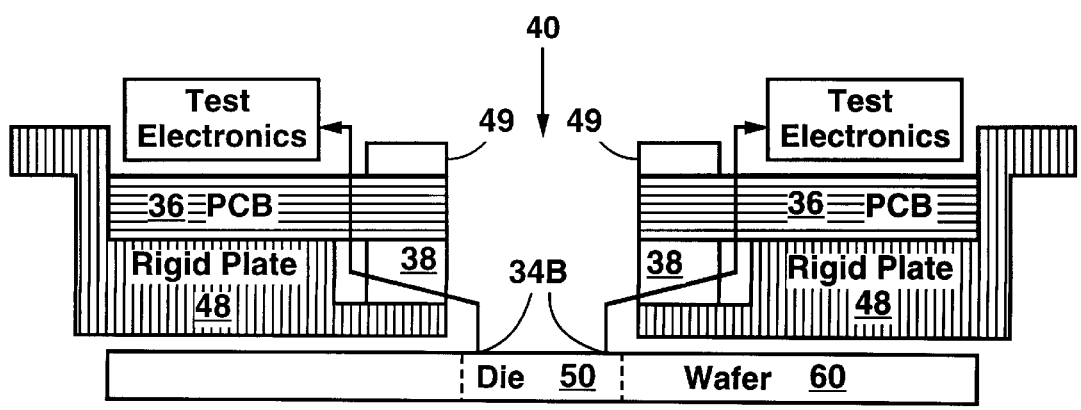
FIG. 7 is another cross sectional side view of the preferred embodiment of the present invention which is capable of contacting to a die attached to a wafer.

FIG. 7 shows an embodiment which is capable of testing dies 50 while still attached to a wafer 60. This is possible because the probe tips 34B extend below the rigid plate 48.

Figure 8A:
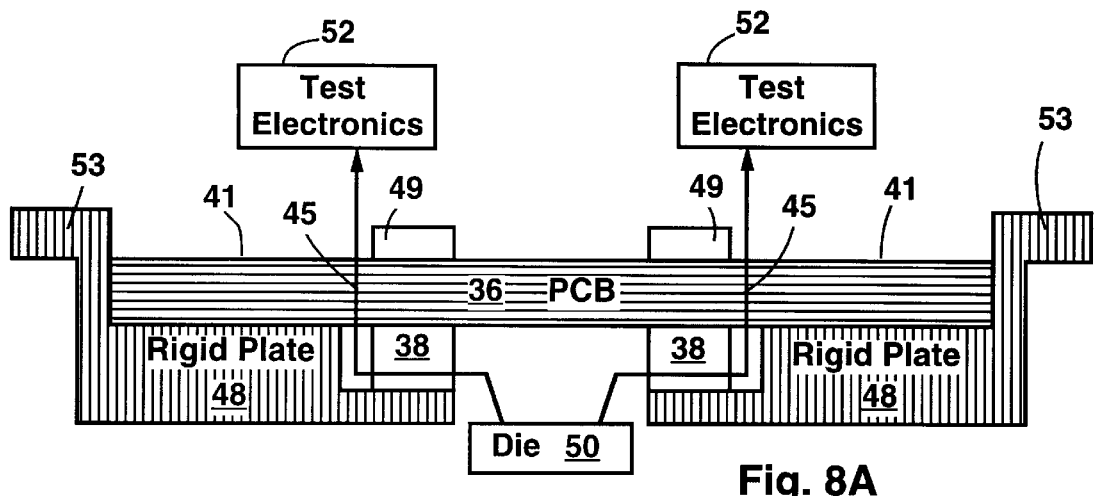
FIG. 8A is a cross sectional side view of an alternative embodiment of the present invention in which an insulating plate does not have a central hole.
Figure 8B:
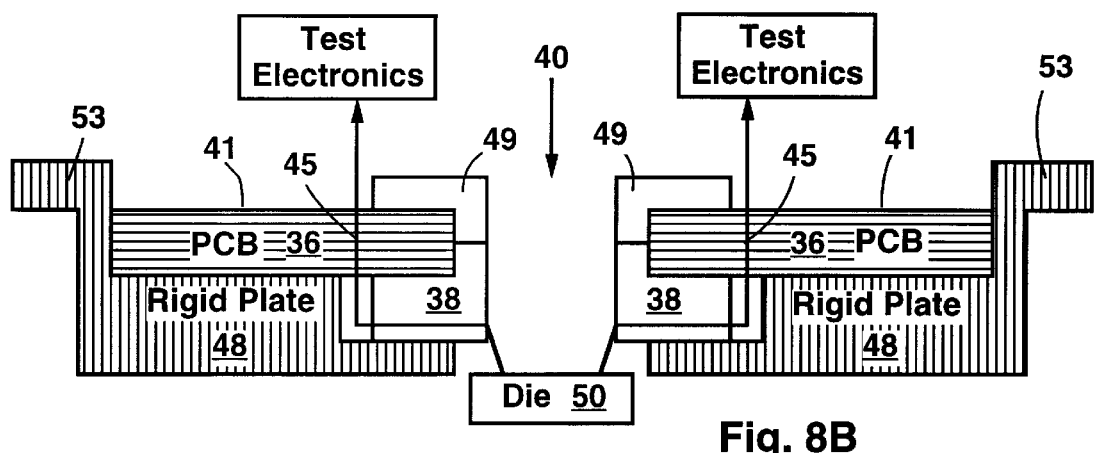
FIG. 8B is a cross sectional side view of an alternative embodiment of the present invention in which an insulating ring and a stiffener ring extend into the central hole.

FIG. 8A shows an alternative embodiment in which the insulating plate 36 does not have a central hole 40. FIG. 8B shows another embodiment in which the insulating ring 38 and stiffener ring 49 extend within the insulating plate central hole 40.

Figure 9:
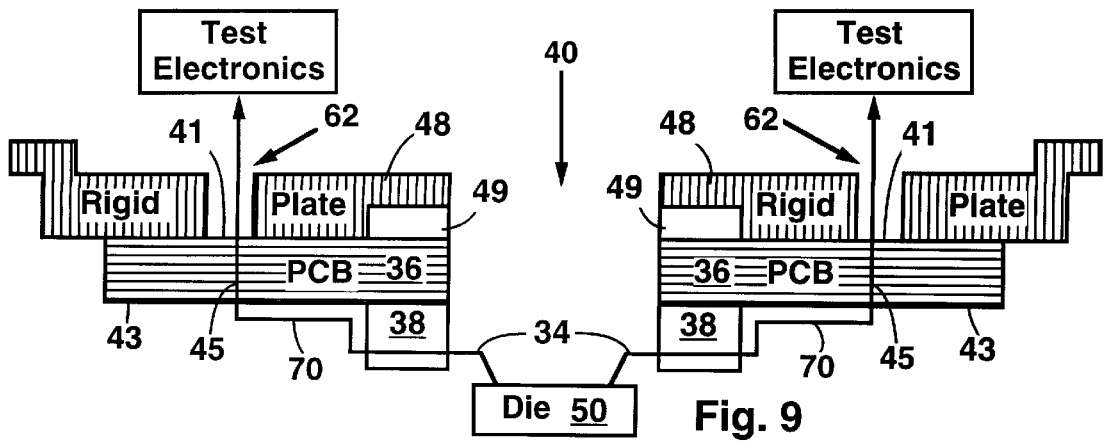
FIG. 9 is a cross sectional side view of an alternative embodiment of the present invention in which a rigid plate is located on a top side.

FIG. 9 shows another alternative embodiment of the present invention. FIG. 9 is a cross sectional view cut across the line 46 of FIG. 3. The rigid plate 48 is attached to the top side 41 of the insulating plate 36 through the stiffener ring 49. Optionally, the stiffener ring 49 is absent and the rigid plate 48 is attached directly to the insulating plate 36. The rigid plate 48 maintains rigidity of the apparatus. This embodiment is not preferred, however, because the insulating ring 38 and bottom side 43 are exposed to the hot semiconductor die 50. The rigid plate 48 offers no heat shielding. Preferably, the rigid plate is shaped to fit over the stiffener ring 49, as shown. Alternatively, the rigid plate 48 can be bonded to the insulating plate top side 41 with glue.

The rigid plate 48 has holes 62. The probes 34 are electrically connected to electrical connections 70 which pass through the vias 45 and rigid plate holes 62. The rigid plate holes 62 allow the probes to be electrically accessed through the rigid plate 48.

Figure 10:
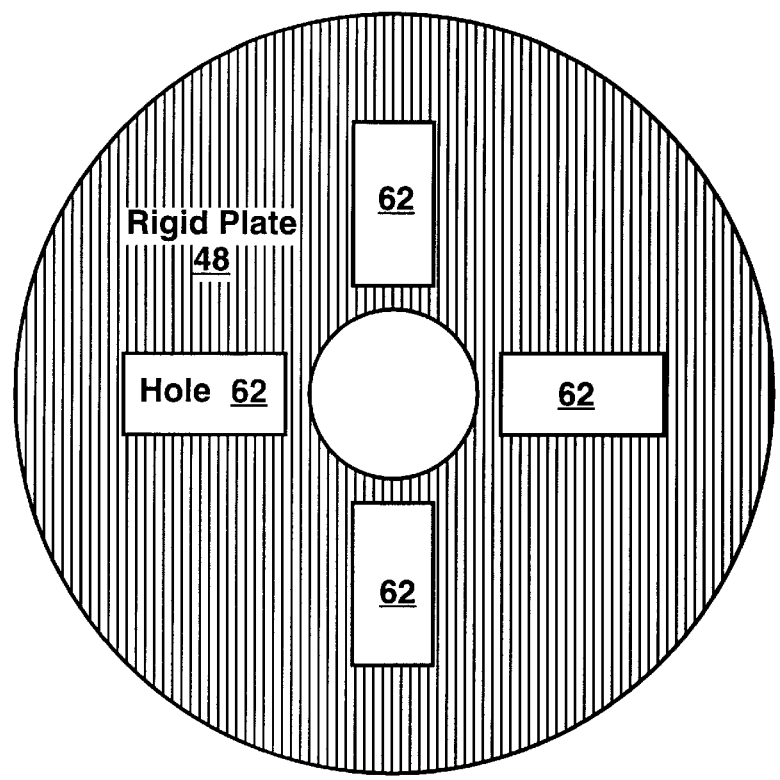
FIG. 10 is a top view of the rigid plate used in the probe card of FIG. 8.

FIG. 10 shows a top view of the rigid plate 48 of FIG. 9. This view illustrates the rigid plate holes 62. It is noted that one hole 62 should exist for each group of probes 34. Two, three, or more holes 62 are made in the rigid plate 48 as appropriate to provide electrical connections 70 between the test electronics and probes 34.

Figure 11:
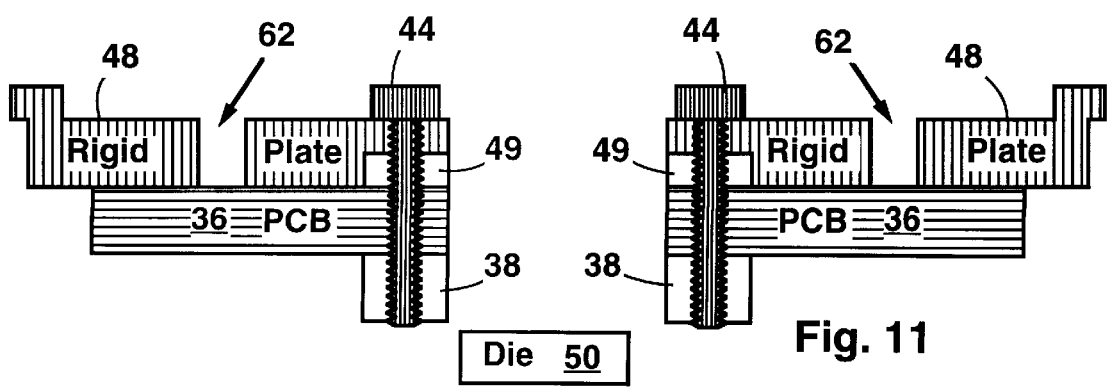
FIG. 11 is another cross sectional side view of the alternative embodiment of FIG. 8.

FIG. 11 shows another cross sectional side view of the same embodiment as FIG. 9. FIG. 11 is a cross sectional view cut across the line 54 of FIG. 3. Bolts 44 are used to attach the rigid plate 48 to the stiffener ring 49. The bolts 44 compress the stiffener ring 49 and insulating plate 36 between rigid plate 48 and insulating ring 38. It is noted that many other attachment means besides bolts 44 can be used. Screws, clamps and rivets are examples of other attachment devices which can be used in place of the bolts 44. In a manner analogous to FIG. 8B, the embodiment of FIGS. 9 and 11 can have a stiffener ring 49 and insulating ring 38 which extends into the central hole 40.

Figure 12:
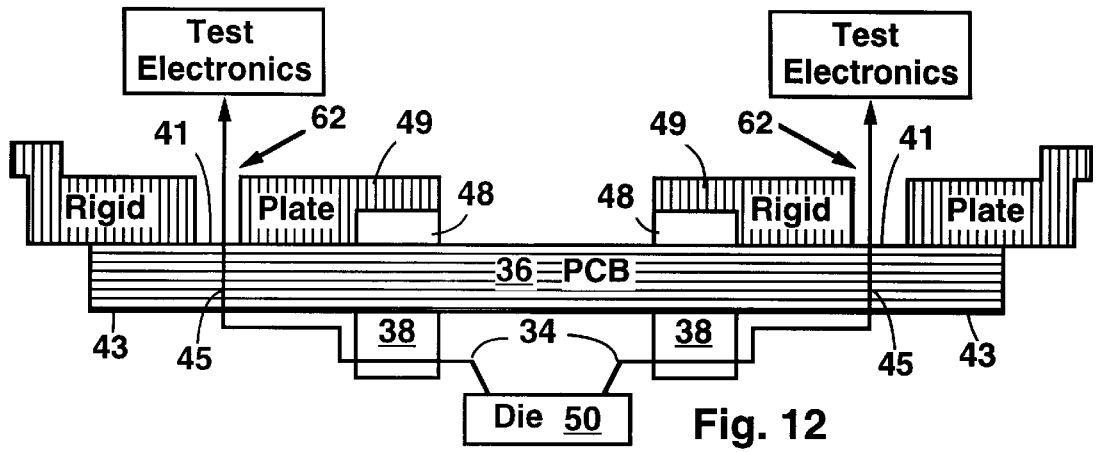
FIG. 12 is a cross sectional side view of an alternative embodiment of the present invention.

FIG. 12 shows an alternative embodiment in which the probe card of FIGS. 9 and 11 has an insulating plate 36 without a central hole 40.

Figure 13:
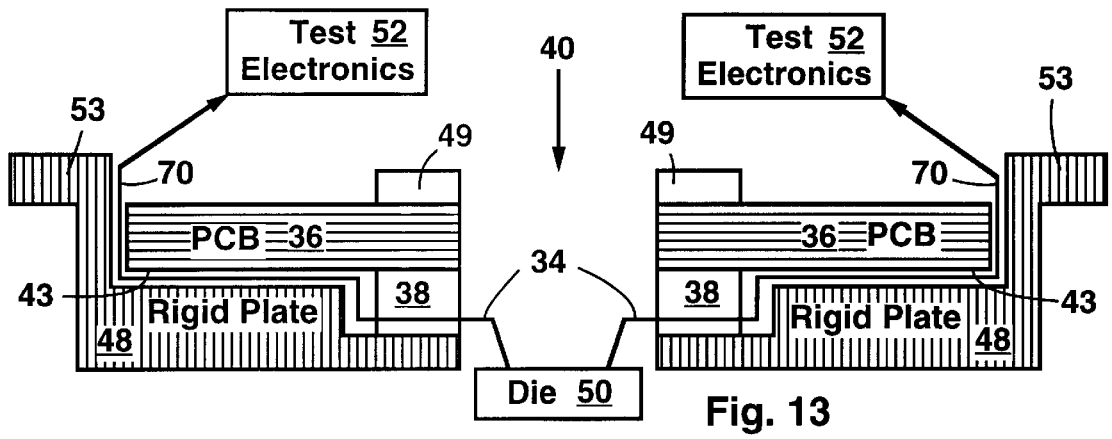
FIG. 13 is a cross sectional side view of an alternative embodiment of the present invention.

FIG. 13 shows an embodiment of the present invention in which the insulating plate 36 does not have vias 45. Electrical connections 70 between the probes 34 and test electronics is made along the bottom side 43, between the rigid plate 48 and insulating plate 36. The electrical connections 70 must be insulated from the rigid plate 48 if the rigid plate is made of conducting material.

Figure 14:
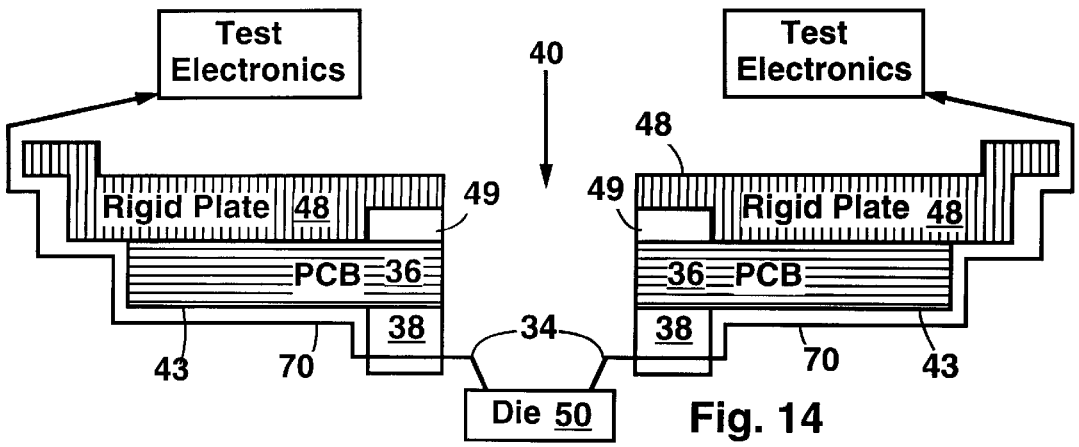
FIG. 14 is a cross sectional side view of an alternative embodiment of the present invention.

FIG. 14 shows an embodiment with the rigid plate 48 on the top side 41 where the rigid plate does not have holes 62 for electrical access. Instead, electrical connections 70 go around the rigid plate 48 and insulating plate 36.

Figure 15:
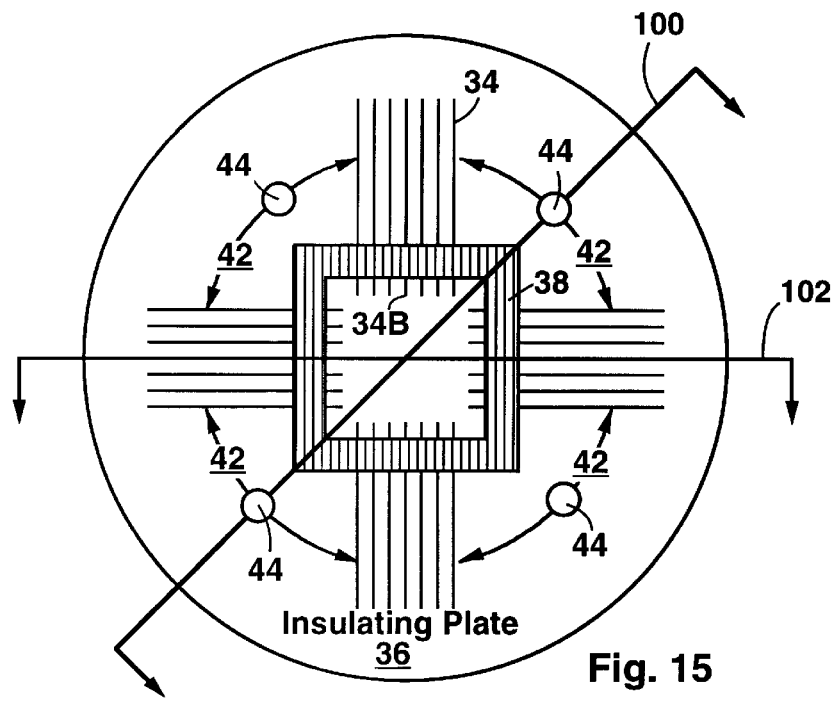
FIG. 15 is a bottom view of an alternative embodiment in which bolts do not extend through the insulating ring.

FIG. 15 shows a bottom view of an alternative embodiment of the present invention. The bolts 44 pass through the insulating plate in a region outside the insulating ring 38. The rigid plate 48 is not shown for clarity.

Figure 16:
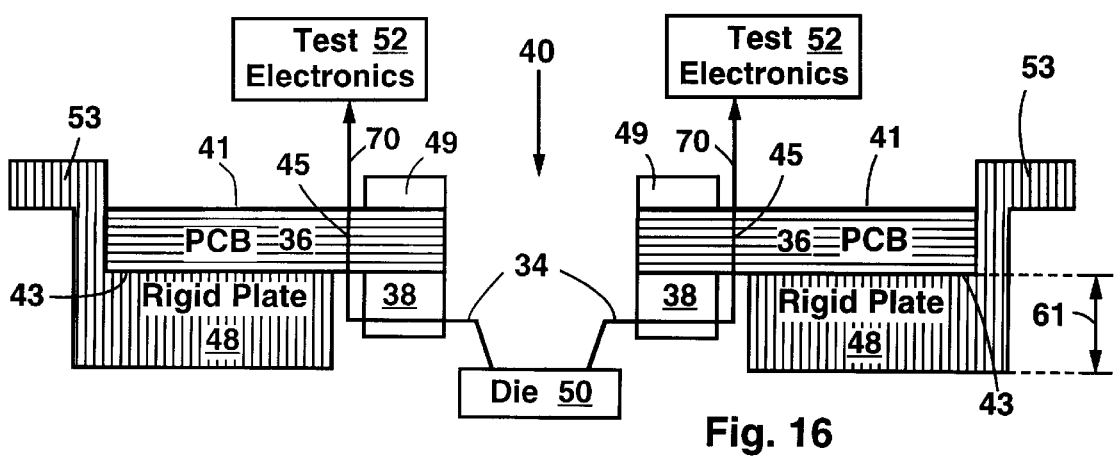
FIG. 16 is a cross sectional side view of the embodiment of FIG. 15.

FIG. 16 shows a cross sectional view cut along line 102 of the alternative embodiment of FIG. 15. The rigid plate 48 does not cover the insulating ring 38 and is not attached to the insulating ring 38. The rigid plate 48 is attached to the insulating plate 36. The insulating plate 36 has a central hole 40. The insulating plate 36 has vias 45 for electrically connecting the probes 34 with test electronics 52. The insulating plate 36 may have a stiffener ring 48 disposed on the top side 41.

Figure 17:
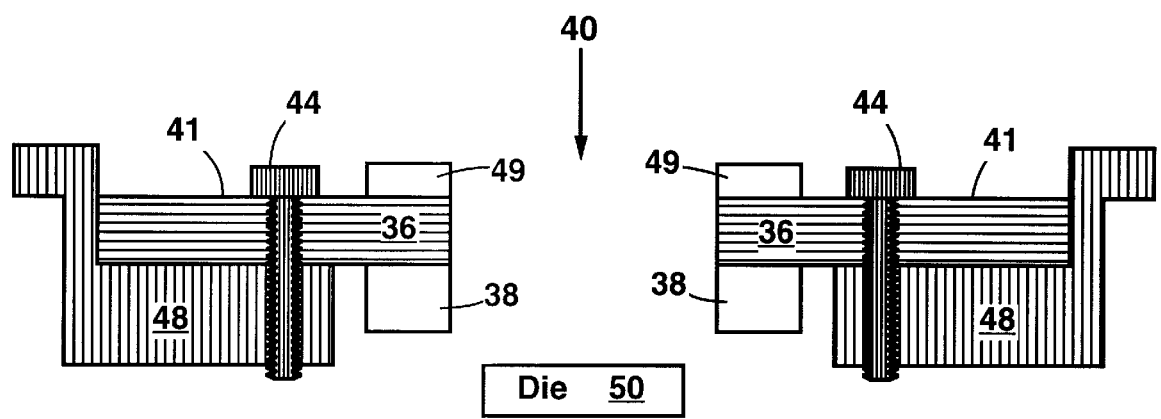
FIG. 17 is a cross sectional side view of the embodiment of FIG. 15 in which the bolts can be seen.

FIG. 17 shows a cross sectional view cut along line 100 of FIG. 15. Bolts 44 extend through the insulating plate 36 and rigid plate 48. The bolts 44 do not extend through the insulating ring 38. Preferably, the bolts 44 are located close to the insulating ring 38. The rigid plate 48 may also be bonded to the insulating plate 36 with adhesive such as epoxy. Preferably, the rigid plate 48 of the embodiment of FIGS. 15, 16, and 17 has thermal expansion slots to minimize buckling during nonuniform exposure to elevated temperatures. Thermal expansion slots are illustrated in FIGS. 6A and 6B.

Although the present invention has been shown having four bolts 44 spaced between four groups of probes 34, it is possible to use two, three, five or more bolts. The bolts can be arranged symmetrically or asymmetrically but should be located within the gaps 42. Also, the number of bolts 44 is not necessarily equal to the number of gaps 42. Each gap 42 may have two or zero bolts 44, for example.

The probe card of the present invention provides increased rigidity and stability for the probes 34 at elevated temperature. Therefore, the probe tips 34B are less likely to become misaligned. Also, the rigid plate 48 provides increased heat shielding and heat conduction away from the insulating ring 38 and insulating plate 36.

It is noted that the probe card of the present invention can be used to test integrated circuits at room temperature. The rigid plate 48 provides increased stability and rigidity for testing semiconductor dies at room temperature and elevated temperature. Probe alignment is a particular concern for semiconductor dies requiring a large number of probes due to the large forces applied. Some semiconductor dies require 1500 probes and each probe may require a contact force of about 10–30 grams. This results in a total contact force in the range of 15–45 kilograms. Such large total contact forces may cause bending or distortion of the probe card and misalignment of the probe tips. The rigid plate renders the probe card resistant to bending and distortion caused by large total contact forces.

It will be clear to one skilled in the art that the above embodiment may be altered in many ways without departing from the scope of the invention. Accordingly, the scope of the invention should be determined by the following claims and their legal equivalents.

What is claimed is:

1. A probe card having a contact force direction, said probe card being centrally assembled by a straining means in said contact force direction, said probe card comprising:
   a) an insulating plate;
   b) an insulating ring having a first fixating plane;
   c) a plurality of probes extending through the insulating ring in a nonuniform radial distribution such that at least 2 gaps exist in the nonuniform radial distribution;
   d) a rigid plate being strained attached to said first fixating plane;
   e) a first straining means for centrally strained attaching the rigid plate to the insulating ring, the straining means being located in the gaps;
   whereby the rigid plate renders the probes resistant to misalignment.

2. The probe card of claim 1 further comprising a stiffener ring disposed on the insulating plate opposite the insulating ring such that the straining means compresses the insulating plate and insulating ring between the stiffener ring and the rigid plate.

3. The probe card of claim 1 wherein the rigid plate is shaped to fit over the insulating ring.

4. The probe card of claim 1 wherein the rigid plate is made of a material that maintains rigidity at elevated temperatures.

5. The probe card of claim 1 wherein the rigid plate has thermal expansion slots.

6. The probe card of claim 5 wherein the thermal expansion slots are angular thermal expansion slots.

7. The probe card of claim 5 wherein the thermal expansion slots are radial thermal expansion slots.

8. The probe card of claim 5 wherein the thermal expansion slots are zig-zag thermal expansion slots having a zig-zag shape.

9. The probe card of claim 1 wherein the straining means is selected from the group consisting of bolts, screws, clamps and rivets.

10. The probe card of claim 1 wherein the rigid plate comprises a material selected from the group consisting of stainless steel, steel, aluminum and ceramics.

11. The probe card of claim 1 wherein the insulating plate has vias for conducting signals from the probes to the top side of the insulating plate.

12. The probe card of claim 1 wherein the rigid plate is bonded to the insulating plate bottom side.

13. The probe card of claim 1 wherein the insulating plate does not have a central hole.

14. The probe card of claim 1 wherein the insulating plate has a central hole and the insulating ring extends within the central hole.

15. A probe card having a contact force direction, said probe card being centrally assembled by a straining means in said contact force direction, said probe card comprising:
   a) an insulating ring having a first fixating plane and an opposing second fixating plane;
   b) a plurality of probes extending through the insulating ring in a nonuniform radial distribution such that at least 2 gaps exist in the nonuniform radial distribution;
   c) an insulating plate being strained attached to said first fixating plane;
   d) a rigid plate being strained attached to said opposing second fixating plane;
   e) a straining means for centrally strained attaching the insulating ring to said insulating plate and to said rigid plate, the straining means being located in the gaps;
   whereby the rigid plate renders the probes resistant to misalignment.

16. The probe card of claim 1 further comprising a stiffener ring disposed on the insulating plate opposite the insulating ring such that the straining means compresses the insulating plate and insulating ring between the stiffener ring and the rigid plate.

17. The probe card of claim 15 wherein the rigid plate is shaped to fit over the stiffener ring.

18. The probe card of claim 15 wherein the rigid plate has at least one rigid plate hole for providing electrical conductors access through the rigid plate.

19. The probe card of claim 1 wherein the straining means is selected from the group consisting of bolts, screws, clamps and rivets.

20. The probe card of claim 15 wherein the rigid plate is made of a material that maintains rigidity at elevated temperatures.

21. The probe card of claim 15 wherein the rigid plate comprises a material selected from the group consisting of stainless steel, steel, aluminum and ceramics.

22. The probe card of claim 15 wherein the insulating plate has vias for conducting signals from the probes to the top side of the insulating plate.

23. The probe card of claim 15 wherein the rigid plate is bonded to the insulating plate top side.

24. The probe card of claim 15 wherein the insulating plate does not have a central hole.

25. The probe card of claim 15 wherein the insulating plate has a central hole and the insulating ring extends within the central hole.

26. A probe card having a contact force direction, said probe card being centrally assembled by a straining means in said contact force direction, said probe card comprising:
   a) an insulating ring having a first fixating plane;
   b) a plurality of probes extending through the insulating ring in a nonuniform radial distribution such that at least 2 gaps exist in the nonuniform radial distribution;
   c) an insulating plate being strained attached to said first fixating plane;
   d) a rigid plate being strained attached to said second fixating plane;
   e) a first straining means for centrally strained attaching the insulating plate so said insulating ring and a second straining means for attaching said rigid plate to said insulating plate, the first straining means being located in the gaps;
whereby the rigid plate renders the probes resistant to misalignment.

27. The probe card of claim 26 further comprising a stiffener ring disposed on the insulating plate top side opposite the insulating ring.

28. The probe card of claim 26 wherein the rigid plate is made of a material that maintains rigidity at elevated temperatures.

29. The probe card of claim 26 wherein the rigid plate has thermal expansion slots.

30. The probe card of claim 29 wherein the thermal expansion slots are angular thermal expansion slots.

31. The probe card of claim 29 wherein the thermal expansion slots are radial thermal expansion slots.

32. The probe card of claim 29 wherein the thermal expansion slots are zig-zag thermal expansion slots having a zig-zag shape.

33. The probe card of claim 26 wherein the straining means is selected from the group consisting of bolts, screws, clamps and rivets.

34. The probe card of claim 26 wherein the rigid plate comprises a material selected from the group consisting of stainless steel, steel, aluminum and ceramics.

35. The probe card of claim 26 wherein the insulating plate has vias for conducting signals from the probes to the top side of the insulating plate.

36. The probe card of claim 26 wherein the insulating plate does not have a central hole.

37. The probe card of claim 26 wherein the insulating plate has a central hole and the insulating ring extends within the central hole.

38. The probe card of claim 1, wherein said rigid plate has a second fixating plane.

39. The probe card of claim 38, wherein said insulating plate is strained attached at said second fixating plane with a second straining means.

40. The probe card of claim 39, wherein said second straining means is selected from the group consisting of bolts, screws, clamps and rivets.

41. The probe card of claim 26, wherein said insulating plate has a second fixating plane.

42. The probe card of claim 41, wherein said rigid plate is strained attached at said second fixating plane with a second straining means.

43. The probe card of claim 42, wherein said second straining means is selected from the group consisting of bolts, screws, clamps and rivets.

* * * * *